(12) United States Patent
Zhang et al.

(10) Patent No.: US 10,665,729 B2
(45) Date of Patent: May 26, 2020

(54) SOLAR CELL MODULE AND METHOD FOR MANUFACTURING THE SAME TECHNICAL FIELD

(71) Applicants: GCL SYSTEM INTEGRATION TECHNOLOGY CO., LTD., Shanghai (CN); GCL INTEGRATION TECHNOLOGY (SUZHOU) CO., LTD., Suzhou (CN); SUZHOU GCLSI SCIENCE AND TECHNOLOGY INDUSTRIAL APPLICATION RESEARCH INSTITUTE CO., LTD., Jiangsu (CN)

(72) Inventors: Yujun Zhang, Shanghai (CN); Zhenlin Dai, Shanghai (CN); Hui Chen, Shanghai (CN); Zhengtong Wu, Shanghai (CN); Songkun Yu, Shanghai (CN); Qiang Huang, Shanghai (CN); Jiazhen Zheng, Shanghai (CN)

(73) Assignees: GCL SYSTEM INTEGRATION TECHNOLOGY CO., LTD., Shanghai (CN); GCL INTEGRATION TECHNOLOGY (SUZHOU) CO., LTD., Jiangsu (CN); SUZHOU GCLSI SCIENCE AND TECHNOLOGY INDUSTRIAL APPLICATION RESEARCH INSTITUTE CO., LTD., Jiangsu ( * ) Notice: Subject to any disclaimer, the term of this patent is extended or adjusted under 35 U.S.C. 154(b) by 166 days.

(21) Appl. No.: 15/745,053

(22) PCT Filed: Feb. 26, 2016

(86) PCT No.: PCT/CN2016/074681
§ 371 (c)(1),
(2) Date: Jan. 15, 2018

(87) PCT Pub. No.: WO2017/140001
PCT Pub. Date: Aug. 24, 2017

(65) Prior Publication Data
US 2018/0212073 A1  Jul. 26, 2018

(30) Foreign Application Priority Data

Feb. 18, 2016  (CN) .......................... 2016 1 0091225

(51) Int. Cl.
*H01L 31/044* (2014.01)
*H01L 31/02* (2006.01)
(Continued)

(52) U.S. Cl.
CPC ........ *H01L 31/02008* (2013.01); *H01L 24/72* (2013.01); *H01L 24/90* (2013.01);
(Continued)

(58) Field of Classification Search
CPC ................. H01L 31/00–078; Y02E 10/50–60
(Continued)

(56) References Cited

U.S. PATENT DOCUMENTS 3,330,700 A    7/1967   Seymour et al.
3,340,096 A * 9/1967   Mann ................. H01L 31/0201
                                                                     136/244
(Continued)

FOREIGN PATENT DOCUMENTS

CN    101779296 A    7/2010
CN    101779298 A    7/2010
(Continued)

OTHER PUBLICATIONS

International Search Report and Written Opinion for Application No. PCT/CN2016/074681 dated Nov. 24, 2016.
(Continued)

*Primary Examiner* — Bach T Dinh
(74) *Attorney, Agent, or Firm* — Miller, Mathias & Hull LLP

(57) ABSTRACT

A solar cell module and a method for manufacturing the same are disclosed. The solar cell module includes a plu-
(Continued)

rality of cell cutting pieces stacked and connected in series, and a connector adapted to connect two adjacent cell cutting pieces in series, the plurality of cell cutting pieces being cut from a solar cell, each cell cutting piece including a front electrode and a back electrode, wherein the connector includes a first surface adapted to connect the front electrode and a second surface adapted to connect the back electrode, the first surface is provided with alternating first connecting areas and first disconnecting areas, the second surface is provided with alternating second connecting areas and second disconnecting areas, and projections of the first disconnecting areas on the first surface overlap with projections of the second connecting areas on the first surface, and wherein the front electrode is adapted to connect the first connecting areas, and the back electrode is adapted to connect the second connecting areas. The solar cell module has improved flexibility, in which grid lines and cells are not easy to be broken.

10 Claims, 7 Drawing Sheets

(51) Int. Cl.
  *H01L 31/05* (2014.01)
  *H01L 23/00* (2006.01)
  *H01L 31/18* (2006.01)

(52) U.S. Cl.
  CPC ...... *H01L 31/0504* (2013.01); *H01L 31/1876* (2013.01); *H01L 2924/0105* (2013.01); *H01L 2924/01013* (2013.01); *H01L 2924/01029* (2013.01); *Y02E 10/50* (2013.01); *Y02P 70/521* (2015.11)

(58) Field of Classification Search
  USPC .................................................. 136/243–265
  See application file for complete search history.

(56) References Cited

U.S. PATENT DOCUMENTS

| | | | |
|---|---|---|---|
| 2005/0257823 A1 | 11/2005 | Zwanenburg | |
| 2009/0151776 A1* | 6/2009 | Schindler | B82Y 10/00 136/251 |
| 2010/0229942 A1 | 9/2010 | Luch | |
| 2012/0199173 A1 | 8/2012 | Bartholomeusz | |
| 2013/0152996 A1 | 6/2013 | Degroot et al. | |
| 2014/0083506 A1* | 3/2014 | Chen | H01L 31/068 136/261 |
| 2015/0349162 A1 | 12/2015 | Morad et al. | |
| 2017/0084766 A1* | 3/2017 | Yang | H01L 31/05 |
| 2018/0367095 A1 | 12/2018 | Morad et al. | |

FOREIGN PATENT DOCUMENTS

| | | |
|---|---|---|
| CN | 103700801 A | 4/2014 |
| CN | 104022166 A | 9/2014 |
| CN | 204067474 U | 12/2014 |
| CN | 104600141 A | 5/2015 |
| CN | 104919597 A | 9/2015 |
| EP | 1598874 A1 | 11/2005 |
| GB | 1333593 A | 10/1973 |
| JP | 1993067017 U | 9/1993 |
| JP | 2009-010355 A | 1/2009 |
| JP | 2009-130193 A | 6/2009 |
| JP | 2011-077174 A | 4/2011 |
| JP | 5306423 B2 | 10/2013 |
| WO | WO 2013/020590 A1 | 2/2013 |
| WO | WO 2014/065016 A1 | 5/2014 |
| WO | WO 2014065016 A1 | 5/2014 |

OTHER PUBLICATIONS

First Search Report & First Office Action for Priority Chinese Patent Application No. 2016/10091225.1, dated Aug. 6, 2016.
Second Search Report & Second Office Action for Priority Chinese Patent application No. 2016/10091225.1, dated Oct. 10, 2016.
First Office Action for Parallel Australian Patent Application No. 2016393430, dated Nov. 9, 2018.
Extended Search Report for Parallel European Patent Application No. 16890234.4, dated Feb. 19, 2019.
First Office Action for Parallel Japanese Patent Application No. 2018-501987, dated Feb. 26, 2019.
International Search Report Application No. PCT/CN2016/074681 reported on Nov. 24, 2016.
First Office Action of Chinese Priority Application No. CN201610091225.1; dated Aug. 8, 2016.
First Search Report of Chinese Priority Application No. CN201610091225.1 and Cited Documents; dated Aug. 8, 2016.
Second Office Action of Chinese Priority Application No. CN201610091225.1 and Cited Document; dated Oct. 10, 2016.
Second Search Report of Chinese Priority Application No. CN201610091225.1 and Cited Documents; dated Oct. 10, 2016.

* cited by examiner

SOLAR CELL MODULE AND METHOD FOR MANUFACTURING THE SAME TECHNICAL FIELD

CROSS-REFERENCE TO RELATED APPLICATION

This patent application is a 35 USC § 371 U.S. national stage of International Application No. PCT/CN2016/074681 filed on Feb. 26, 2016, which claims priority under the Paris Convention to the Chinese Patent Application No, CN 201610091225.1 filed on Feb. 18, 2016.

FIELD OF THE DISCLOSURE

The present disclosure relates to the technical field of solar cell, and more particularly, to a solar cell module and a method for manufacturing the same.

BACKGROUND OF THE DISCLOSURE

As a new energy resource, solar energy has a number of advantages over conventional fossil fuels in the aspects of inexhaustibility, environmental protection, and the like. There are many ways of using the solar energy at present. The main way is receiving and converting the solar energy into electric energy with a solar cell module. A traditional solar cell module is a large-area square array formed by a plurality of packaged cell assemblies, each cell assembly including a number of solar cell pieces (also known as photovoltaic cells) connected in series. The solar cell may absorb the solar energy, and hetero charges may accumulate at both ends of the cell, that is, a "photovoltaic voltage" may be created. This is known as "photovoltaic effect". In the photovoltaic effect, an electromotive force may be generated between the ends of the cell. In this way, the solar energy may be converted into electric energy. However, the traditional solar cell is large in size, and the solar cell assembly formed by connecting such solar cells in series has a non-uniform distribution of current density, and large power loss.

Given the above, the traditional solar cell may be cut into several cell cutting pieces, and the cell cutting pieces may be made into a high-density assembly to reduce electric current, so that the power loss of the solar cell module is reduced. In this traditional solar cell module, positive and negative electrodes of the cell cutting pieces are generally connected with solder paste. However, the cell string formed by the cell cutting pieces connected with solder paste lacks of flexibility along its length, so that the whole solar cell module is poor in flexibility. There is cracking risk in such solar cell module, and grid lines or cells of the solar cell module tend to be broken, when the solar cell module is under external load or high and low temperature impact. The traditional solar cell module thus is inconvenient to practical application.

SUMMARY OF THE DISCLOSURE

Based on the above, it is necessary to address the problem of easy breaking of grid lines or cells of the traditional solar cell module, by providing a solar cell module in which grid lines and cells do not easily break.

A solar cell module is provided, including a plurality of cell cutting pieces stacked and connected in series, and a connector adapted to connect two adjacent cell cutting pieces in series, the plurality of cell cutting pieces being cut from a solar cell, each cell cutting piece including a front electrode and a back electrode, wherein the connector includes a first surface adapted to connect the front electrode and a second surface adapted to connect the back electrode, the first surface is provided with alternating first connecting areas and first disconnecting areas, the second surface is provided with alternating second connecting areas and second disconnecting areas, and projections of the first disconnecting areas on the first surface overlap with projections of the second connecting areas on the first surface, and wherein the positive electrode is adapted to connect the first connecting areas, and the back electrode is adapted to connect the second connecting areas.

In the above solar cell module, when two adjacent cell cutting pieces are stacked and connected in series with each other by the connector, a buffer space may be formed by retaining a flexible buffer area, since the projections of the first disconnecting areas on the first surface covering the projections of the second connecting areas on the first surface, that is, the connection positions between the positive electrode and the first surface of the connector and the connection positions between the back electrode and the second surface of the connector are non-overlapped. In this way, the flexibility of the solar cell module is improved, so that the solar cell module has enough flexibility to be deformed to withstand various external or internal stresses, to reduce risk of cracking in the solar cell module and risk of breaking of grid lines or cells of the solar cell, which is advantageous for practical application.

In one embodiment, the projections of the first connecting areas on the first surface are first projections, the projections of the second connecting areas on the first surface are second projections, and any one of the first projections is 1 mm to 20 mm away from an adjacent second projection.

In one embodiment, each cell cutting piece includes a plurality of front electrodes separated from each other and arranged along the length of the cell cutting piece, and a plurality of back electrodes separated from each other and arranged along the length of the cell cutting piece.

In one embodiment, both the from electrode and the back electrode extend along the length of the cell cutting piece, and each first disconnecting area and each second disconnecting area are provided with a first welding barrier and a second welding barrier respectively.

In one embodiment, both the front electrode and the back electrode extend along the length of the cell cutting piece, the front electrode is provided with alternating third connecting areas and third disconnecting areas, and the back electrode is provided with alternating fourth connecting areas and fourth disconnecting areas; and the third connecting areas are adapted to connect the first connecting areas, the fourth connecting areas are adapted to connect the second connecting areas, and each third disconnecting area and each fourth disconnecting area are provided with a third welding barrier and a fourth welding barrier respectively.

In one embodiment, the connector includes a first connecting plate, a second connecting plate and a buffer plate positioned between the first connecting plate and the second connecting plate, two ends of the buffer plate are connected to the first connecting plate and the second connecting plate respectively, and a deformation space is formed between the buffer plate and the first connecting plate, and between the buffer plate and the second connecting plate respectively.

In one embodiment, the connector has a lateral side provided with a groove or a through hole.

In addition, a method for manufacturing a solar cell module is also provided, including the following steps:

providing cell cutting pieces, the cell cutting pieces being cut from a solar cell, each cell cutting piece including a plurality of front electrodes separated from each other and arranged along the length of the cell cutting piece, and a plurality of back electrodes separated from each other and arranged along the length of the cell cutting piece;

providing connectors, each connector including a first surface corresponding to the front electrodes, and a second surface corresponding to the back electrodes;

connecting the positive electrodes to the first surface to form alternating first connecting areas and first disconnecting areas on the first surface, and connecting the back electrodes of an adjacent cell cutting piece to the second surface to form alternating second connecting areas and second disconnecting areas on the second surface, so that the cell cutting pieces are connected in series with each other, wherein projections of the first disconnecting areas on the first surface overlap with projections of the second connecting areas on the first surface; and stacking and connecting the cell cutting pieces in a series-parallel connection form to obtain the solar cell module.

For the solar cell module obtained by the above manufacturing method, when two adjacent cell cutting pieces are stacked and connected in series with each other by the connector, a buffer space may be formed by retaining a flexible buffer area, since the projections of the first disconnecting areas on the first surface overlap with the projections of the second connecting areas on the first surface, that is, the connection positions between the front electrode and the first surface of the connector and the connection positions between the back electrode and the second surface of the connector being non-overlapped. In this way, the flexibility of the solar cell module is improved, so that the solar cell module has enough flexibility to be deformed to withstand various external and internal stresses, to reduce risk of cracking in the solar cell module and risk of breaking of grid lines or cells of the solar cell, which is advantageous for practical application.

A method for manufacturing a solar cell module is further provided, including the following steps:

providing cell cutting pieces, the cell cutting pieces being cut from a solar cell, each cell cutting piece including a front electrode and a back electrode both extending along the length of the cell cutting piece;

providing a connector, the connector including a first surface corresponding to the front electrodes, and a second surface corresponding to the back electrodes;

arranging first welding barriers separated from each other on the first surface to form first disconnecting areas for blocking welding, and first connecting areas each positioned between two adjacent first disconnecting areas, the first connecting areas and the first disconnecting areas being arranged alternately;

arranging a plurality of second welding barriers separated from each other on the second surface, to form second disconnecting areas and second connecting areas each positioned between two adjacent second disconnecting areas, the second connecting areas and the second disconnecting areas being arranged alternately, projections of the first disconnecting areas on the first surface overlap with projections of the second connecting areas on the first surface;

connecting the first connecting areas to the front electrode, and connecting the second connecting areas to the back electrode, to make the cell cutting pieces connected in series with each other; and stacking and connecting the cell cutting pieces in a series-parallel connection form to obtain the solar cell module.

For the solar cell module obtained by the above manufacturing method, when two adjacent cell cutting pieces are stacked and connected in series with each other by the connector, a buffer space may be formed by retaining a flexible buffer area, since the projections of the first disconnecting areas on the first surface overlap with the projections of the second connecting areas on the first surface, that is, the connection positions between the front electrode and the first surface of the connector and the connection positions between the back electrode and the second surface of the connector being non-overlapped. In addition, the first and second welding barriers are adapted to block the welding, and have certain flexibility to act as a buffer. In this way, the flexibility of the solar cell module is improved, so that the solar cell module has enough flexibility to be deformed to withstand various external and internal stresses, to reduce the risk of cracking in the solar cell module and risk of breaking of grid lines or cells of the solar cell, which is advantageous for practical application.

A method for manufacturing a solar cell module is further provided, including the following steps:

providing cell cutting pieces, the cell cutting pieces being cut from a solar cell, each cell cutting piece including a front electrode and a back electrode both extending along the length of the cell cutting piece;

providing a connector, the connector including a first surface corresponding to the plurality of front electrodes, and a second surface corresponding to the plurality of back electrodes;

arranging a plurality of third welding barriers separated from each other on the front electrode, to form third disconnecting areas for blocking welding, and third connecting areas each positioned between two adjacent third disconnecting areas, the third connecting areas and the third disconnecting areas being arranged alternately;

arranging fourth welding barriers separated from each other on the back electrode, to form fourth disconnecting areas for blocking welding, and fourth connecting areas each positioned between two adjacent fourth disconnecting areas, the fourth connecting areas and the fourth disconnecting areas being arranged alternately;

connecting the third connecting areas to the first surface to form alternating first connecting areas and first disconnecting areas on the first surface, and connecting the fourth connecting areas to the second surface to form alternating second connecting areas and second disconnecting areas on the second surface, so that the cell cutting pieces are connected in series with each other, wherein projections of the first disconnecting areas on the first surface overlap with projections of the second connecting areas on the first surface; and overlapping and connecting the cell cutting pieces in a series-parallel connection form to obtain the solar cell module.

For the solar cell module obtained by the above manufacturing method, when two adjacent cell cutting pieces are stacked and connected in series with each other by the connector, a buffer space may be formed by retaining a flexible buffer area, since the projections of the first disconnecting areas on the first surface overlap with the projections of the second connecting areas on the first surface, that is, the connection positions between the positive electrode and the first surface of the connector and the connection positions between the back electrode and the second surface of the connector being non-overlapped. In addition, the third and fourth welding barriers are adapted to block the welding, and have certain flexibility to act as a buffer. In this way, the flexibility of the solar cell module is improved, so that the solar cell module has enough flexibility to be deformed to withstand various external and internal stresses, to reduce the risk of cracking in the solar cell module and risk of breaking of grid lines or cells of the solar cell, which is advantageous for practical application.

DETAILED DESCRIPTION OF THE DISCLOSURE

In the following description of embodiments, reference is made to the accompanying drawings which form a part hereof, and in which it is shown by way of illustration specific embodiments of the disclosure that can be practiced. It is to be understood that other embodiments can be used and structural changes can be made without departing from the scope of the disclosed embodiments.

It will be understood that, when a feature or element is herein referred to as being "on" another feature or element, it can be directly on the other feature or element or intervening features and/or elements may also be present. It will also be understood that, when a feature or element is referred to as being "connected", "attached" or "connected" to another feature or element, it can be directly connected, attached or connected to the other feature or element or intervening features or elements may be present.

As used herein in the specification and claims, including as used in the examples and unless otherwise expressly specified, all technical and scientific terms may be read as common understanding of one of ordinary skill in the art. Terminology used herein is for the purpose of describing particular embodiments only and is not intended to be limiting of the invention. As used herein, the term "and/or" includes any and all combinations of one or more of the associated listed items and may be abbreviated as "/".

In one embodiment, the solar cell module includes a plurality of cell cutting pieces stacked and connected in series, and a connector adapted to connect two adjacent cell cutting pieces in series. The cell cutting pieces are cut from a solar cell. The solar cell may be cut into a plurality of cell cutting pieces equally or unequally. The cell cutting pieces may be combined in series, as appropriate in practice. Each cell cutting piece includes a front electrode and a back electrode.

Figure 1:
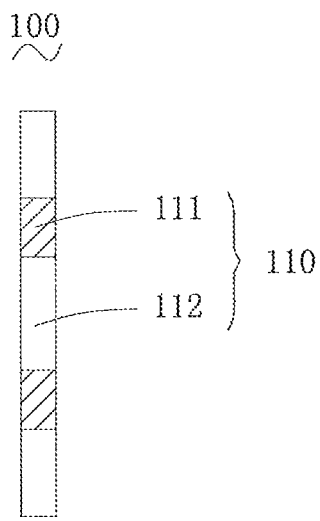
FIG. 1 is a schematic diagram illustrating a first surface of a connector according to an embodiment of the present disclosure.
Figure 2:
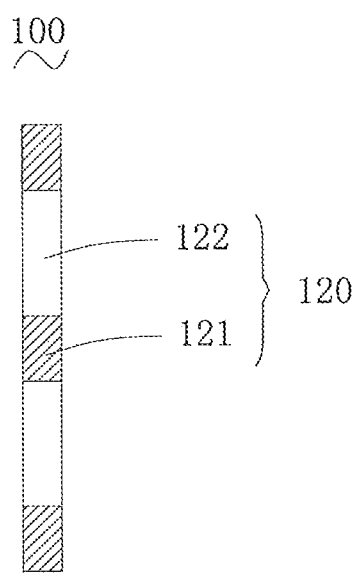
FIG. 2 is a schematic diagram illustrating a second surface of a connector according to one embodiment of the present disclosure.

As shown in FIG. 1 and FIG. 2, a connector 100 is provided in the solar cell module according to this embodiment. The connector 100 includes a first surface 110 adapted to connect the front electrode and a second surface 120 adapted to connect the back electrode. The first surface 110 is provided with alternating first connecting areas 111 and first disconnecting areas 112. The second surface 120 is provided with alternating second connecting areas 121 and second disconnecting areas 122. Projections of the first disconnecting areas 112 on the first surface 110 overlap with projections of the second connecting areas 121 on the first surface 110.

The front electrode is adapted to connect the first connecting areas 111, and the back electrode is adapted to connect the second connecting areas 121.

Figure 3:
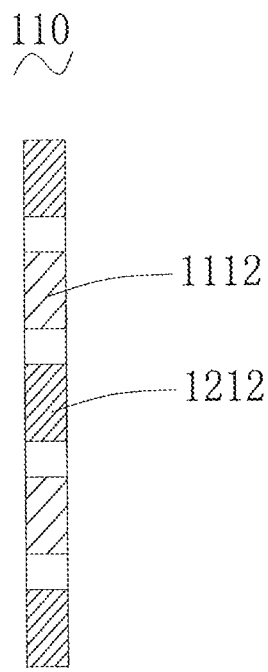
FIG. 3 is a schematic diagram illustrating the respective projections of first connecting areas and second connecting areas on the first surface according to one embodiment of the present disclosure.

As shown in FIG. 3, in one of the embodiments, the projections of the first connecting areas 111 on the first surface 110 are first projections 1112, and the projections of the second connecting areas 121 on the first surface 110 are second projection 1212. The interval distance between the first projection 1112 and an adjacent second projection 1212 may be any value within the range of 1 mm to 20 mm. Within this range, buffer areas may be formed between the connecting areas to the front electrode and the back electrode, so that the flexibility of the solar cell module is improved to reduce the cracking risk in the solar cell module, and grid lines or cells of the solar cell module will not easily break. It will be appreciated that interval distance is not limited to the above range, and can be any other appropriate values.

In the above solar cell module, when two adjacent cell cutting pieces are stacked and connected in series by the connector, a buffer space may be formed by retaining a flexible buffer area as the projections of the first disconnecting areas on the first surface overlap with the projections of the second connecting areas on the first surface, that is, the connection positions between the front electrode and the first surface of the connector and the connection positions between the back electrode and the second surface of the connector are non-overlapped. In this way, the flexibility of the solar cell module is improved, so that the solar cell module has enough flexibility to be deformed to withstand various external or internal stresses, to reduce the risk of cracking in the solar cell module and risk of breaking of grid lines or cells of the solar cell, which is advantageous for practical application.

In order to increase the flexibility of the solar cell module, the connector is a flexible connector in this embodiment. The flexible connector may be selected from at least one of copper foil, aluminum foil, and tin plated copper foil. The flexible connector may also be selected from other materials with low yield force. Since the flexible connector may have some tension, the buffer area should be designed to remove stress to avoid excessive stress in the cell cutting piece along the grid line. For example, the lateral side of the flexible connector may be provided with a groove or a through hole to enhance the abilities of the solar cell module to with stand cracking and load.

Of course, other designs may be used in the connector. FIG. 4~9 are side views showing connectors according to other embodiments.

Figure 4:
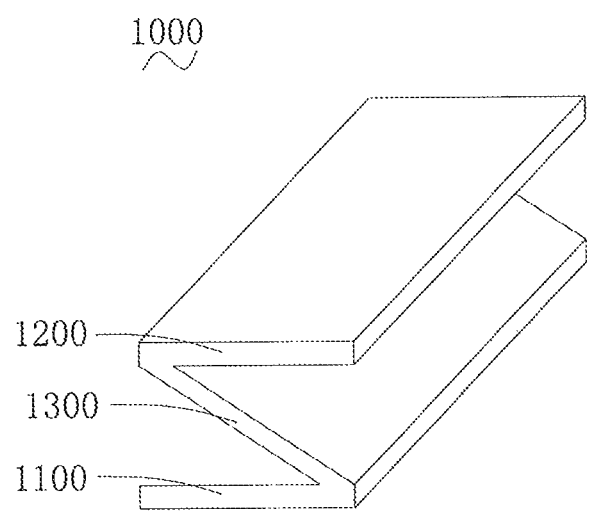
FIG. 4 is a perspective schematic diagram illustrating a connector according to one embodiment of the present disclosure.

As shown in FIG. 4, in one of the embodiments, the connector 1000 includes a first welding plate 1100, a second welding plate 1200, and a buffer plate 1300 positioned between the first welding plate 1100 and the second welding plate 1200. Two ends of the buffer plate 1300 are connected to the first welding plate 1100 and the second welding plate 1200, respectively. The first welding plate 1100 is adapted to be welded to the front electrode of the cell cutting piece, and the second welding plate 1200 is adapted to be welded to the back electrode of an adjacent cell cutting piece.

As shown in FIG. 4, the first welding plate 1100 and the second welding plate 1200 are integrated with the buffer plate 1300, and the buffer plate 1300 is arranged in an inverted Z shape. In this embodiment, the connector 1000 is a flexible member. When two adjacent cell cutting pieces are welded by alternating intervals using the connector 1000 of this embodiment, deformation space may be formed between the buffer plate 1300 and the first welding plate 1100, and between the buffer plate 1300 and the second welding plate 1200, respectively. In this way, the flexibility of the solar cell module is improved to reduce the risk of cracking between two adjacent cell cutting pieces, thus improving the reliability of the whole solar cell module, which is advantageous for its application.

Figure 5:
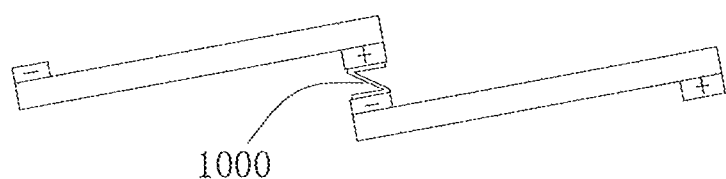
FIG. 5 is a side view showing a connection between two adjacent cell cutting pieces according to one embodiment of the present disclosure.

As shown in FIG. 5, two adjacent cell cutting pieces are welded by segmented welding using the connector 1000 according to Example Two. The back electrode of the left cell cutting piece has a width slightly larger than the front electrode of the right cell cutting piece, and the connector 1000 has a width less than the front electrode of the right cell cutting piece, to avoid decrease in the irradiation area caused by the exposure of the front electrode or the connector 1000 due to deviation between the positions of the two adjacent cell cutting pieces during their placement.

Figure 6:
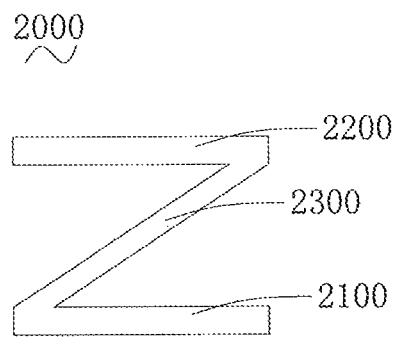
FIG. 6 is a side view showing a connector according to one embodiment of the present disclosure.

As shown in FIG. 6, in this embodiment, the connector 2000 includes a first welding plate 2100, a second welding plate 2200 and a buffer plate 2300 positioned between the first welding plate 2100 and the second welding plate 2200. The two ends of the buffer plate 2300 are connected to the first welding plate 2100 and the second welding plate 2200, respectively. As shown in FIG. 6, the first welding plate 2100 and the second welding plate 2200 are integrated with the buffer plate 2300, and the buffer plate 2300 is in the form of a flat plate arranged in an inverted Z shape.

Figure 7:
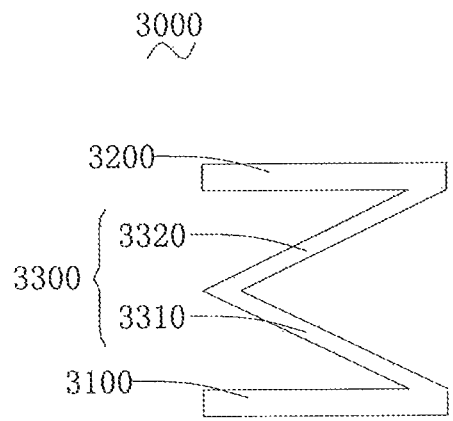
FIG. 7 is a side view showing a connector according to one embodiment of the present disclosure.

As shown in FIG. 7, in this embodiment, the connector 3000 includes a first welding plate 3100, a second welding plate 3200, and a buffer plate 3300 positioned between the first welding plate 3100 and the second welding plate 3200. The buffer plate 3300 includes a first buffer sub-plate 3310 and a second buffer sub-plate 3320. Both the first buffer sub-plate 3310 and the second buffer sub-plate 3320 are plate shaped, and connected end to end sequentially. The first buffer sub-plate 3310 is connected to the first welding plate 3100 and the second buffer sub-plate 3320 is connected to the second welding plate 3200. In this embodiment, deformation space may be formed between the buffer plate 3300 and the first welding plate 3100, between the buffer plate 3300 and the second welding plate 3200, and between the first buffer sub-plate 3310 and the second buffer sub-plate 3320 respectively. In this way, the flexibility of the solar cell module is improved to reduce the risk of cracking between the two adjacent cell cutting pieces, improving the reliability of the whole solar cell module, which is advantageous for application.

Figure 8:
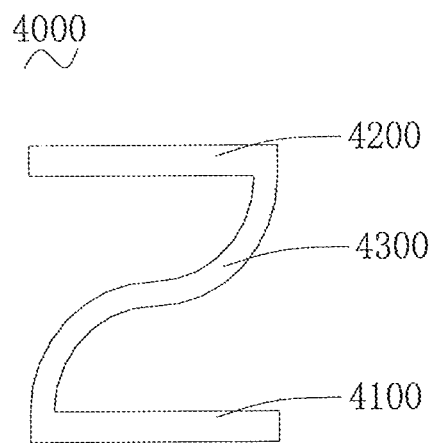
FIG. 8 is a side view showing a connector according to one embodiment of the present disclosure.

As shown in FIG. 8, in this embodiment, the connector 4000 includes a first welding plate 4100, a second welding plate 4200 and a buffer plate 4300 positioned between the first welding plate 4100 and the second welding plate 4200. The two ends of the buffer plate 4300 are connected to the first welding plate 4100 and the second welding plate 4200, respectively. The buffer plate 4300 has two surfaces facing the first welding plate 4100 and the second welding plate 4200 respectively, and both surfaces are smoothly curved surfaces with a constant curvature. The buffer plate 4300 may form a deformable space itself. In addition, deformation space may be formed between the buffer plate 4300 and the first welding plate 4100, and between the buffer plate 4300 and the second welding plate 4200 respectively. In this way, the flexibility of the solar cell module is improved to reduce the risk of cracking between the two adjacent cell cutting pieces, improving the reliability of the whole solar cell module, which is advantageous for the application.

Figure 9:
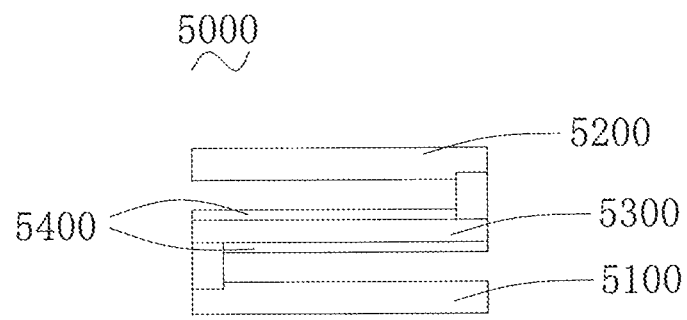
FIG. 9 is a side view showing a connector according to one embodiment of the present disclosure.

As shown in FIG. 9, in this embodiment, the connector 5000 includes a first welding plate 5100, a second welding plate 5200 and a buffer plate 5300 positioned between the first welding plate 5100 and the second welding plate 5200. The two ends of the buffer plate 5300 are connected to the first welding plate 5100 and the second welding plate 5200 respectively. In this embodiment, the two ends of the buffer plate 5300 are connected to the first welding plate 5100 and the second welding plate 5200, respectively, by welding with the conductive metal copper. Meanwhile, the surface of the buffer plate 5300, except for the portions connected to the first welding plate 5100 and the second welding plate 5200, are coated by a welding barrier 5400 for blocking welding. The welding barrier 5400 is a flexible welding barrier, such as adhesive sticker, ink or the like. In this way, it can prevent the upper left corner of the buffer plate 5300 from being welded to the second welding plate 5200, or the lower right corner of the buffer plate 5300 welded to the first welding plate 5100, to avoid decrease in the deformation space. It will be appreciated that the welding barrier is not limited to the above materials, but can also be other coating with the function of blocking welding.

In addition, the present disclosure also provides the following methods for manufacturing a solar cell module.

In one embodiment, a method for manufacturing a solar cell module is also provided, including the following steps:

S10, providing cell cutting pieces, the cell cutting pieces being cut from a solar cell, each cell cutting piece including a plurality of front electrodes separated from each other and arranged along the length of the cell cutting piece, and a plurality of back electrodes separated from each other and arranged along the length of the cell cutting piece;

S20, providing connectors, each connector including a first surface corresponding to the front electrodes, and a second surface corresponding to the back electrodes;

S30, connecting the front electrodes to the first surface to form alternating first connecting areas and first disconnecting areas on the first surface, and connecting the back electrodes of an adjacent cell cutting piece to the second surface to form alternating second connecting areas and second disconnecting areas on the second surface, so that the cell cutting pieces are connected in series with each other, wherein projections of the first disconnecting areas on the first surface overlap with projections of the second connecting areas on the first surface; and S40, stacking and connecting the cell cutting pieces in a series-parallel connection form to obtain the solar cell module.

For the solar cell module obtained by the above manufacturing method, when two adjacent cell cutting pieces are stacked and connected in series with each other by the connector, a buffer space may be formed by retaining a flexible buffer area, since the projections of the first disconnecting areas on the first surface overlap with the projections of the second connecting areas on the first surface, that is, the connection positions between the front electrode and the first surface of the connector and the connection positions between the back electrode and the second surface of the connector being non-overlapped. In this way, the flexibility of the solar cell module is improved, so that the solar cell module has enough flexibility to be deformed to withstand various external and internal stresses, to reduce the cracking risk in the solar cell module. Grid lines or cells of the solar cell module are difficult to be broken, so the traditional solar cell module thus is convenient to practical application.

In another embodiment, a method for manufacturing a solar cell module is provided, including the following steps:

S100, providing cell cutting pieces, the cell cutting pieces being cut from a solar cell, each cell cutting piece including a front electrode and a back electrode both extending along the length of the cell cutting piece;

S200, providing a connector, the connector including a first surface corresponding to the electrodes, and a second surface corresponding to the back electrodes;

S300, arranging first welding barriers separated from each other on the first surface, to form first disconnecting areas for blocking welding, and first connecting areas each positioned between two adjacent first disconnecting areas, the first connecting areas and the first disconnecting areas being arranged alternately;

S400, arranging a plurality of second welding barriers separated from each other on the second surface, to form second disconnecting areas and second connecting areas each positioned between two adjacent second disconnecting areas, the second connecting areas and the second disconnecting areas being arranged alternately, projections of the first disconnecting areas on the first surface overlapping with projections of the second connecting areas on the first surface;

S500 connecting the first connecting areas to the front electrode, and connecting the second connecting areas to the back electrode, to make the cell cutting pieces connected in series with each other; and S600, stacking and connecting the cell cutting pieces in a series-parallel connection form to obtain the solar cell module.

For the solar cell module obtained by the above manufacturing method, when two adjacent cell cutting pieces are stacked and connected in series with each other by the connector, a buffer space may be formed by retaining a flexible buffer area, since the projections of the first disconnecting areas on the first surface overlap with the projections of the second connecting areas on the first surface, that is, the connection positions between the front electrode and the first surface of the connector and the connection positions between the back electrode and the second surface of the connector being non-overlapped. In addition, the first and second welding barriers are adapted to block the welding, and have certain flexibility to act as a buffer to act as a buffer. In this way, the flexibility of the solar cell module is improved, so that the solar cell module has enough flexibility to be deformed to withstand various external or internal stresses, to reduce the risk of cracking in the solar cell module and risk of breaking of grid lines or cells of the solar cell, which is advantageous for practical application.

In a further embodiment, a method for manufacturing a solar cell module is provided, including the following steps:

S1000, providing cell cutting pieces, the cell cutting pieces being cut from a solar cell, each cell cutting piece including a front electrode and a back electrode bath extending along the length of the cell cutting piece;

S2000, providing a connector, the connector including a first surface corresponding to the front electrodes, and a second surface corresponding to the back electrodes;

S3000, arranging third welding barriers separated from each other on the front electrode, to form third disconnecting areas for blocking welding, and third connecting areas each positioned between two adjacent third disconnecting areas, the third connecting areas and the third disconnecting areas being arranged alternately;

S4000, arranging fourth welding barriers separated from each other on the back electrode, to form fourth disconnecting areas for blocking welding, and fourth connecting areas each positioned between two adjacent fourth disconnecting areas, the fourth connecting areas and the fourth disconnecting areas being arranged alternately;

S5000, connecting the third connecting areas to the first surface to form alternating first connecting areas and first disconnecting areas on the first surface, and connecting the fourth connecting areas to the second surface to form alternating second connecting areas and second disconnecting areas on the second surface, so that the cell cutting pieces are connected in series with each other, wherein projections of the first disconnecting areas on the first surface overlap with projections of the second connecting areas on the first surface; and S6000, overlapping and connecting the cell cutting pieces in a series-parallel connection form to obtain the solar cell module.

For the solar cell module obtained by the above manufacturing method, when two adjacent cell cutting pieces are stacked and connected in series with each other by the connector, a buffer space may be formed by retaining a flexible buffer area, since the projections of the first disconnecting areas on the first surface overlap with the projections of the second connecting areas on the first surface, that is, the connection positions between the front electrode and the first surface of the connector and the connection positions between the back electrode and the second surface of the connector being non-overlapped. In addition, the third and fourth welding barriers are adapted to block the welding, and have certain flexibility to act as a buffer. In this way, the flexibility of the solar cell module is improved, so that the solar cell module has enough flexibility to be deformed to withstand various external and internal stresses, to reduce the risk of cracking in the solar cell module and risk of breaking of grid lines or cells of the solar cell, which is advantageous for practical application.

The solar cell module according to the present disclosure will be further described in conjunction with the following examples.

Example One

Figure 10:
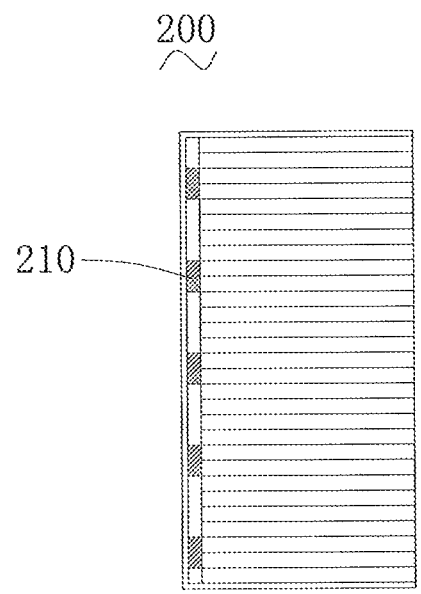
FIG. 10 is a front view showing a cell cutting piece according to Example One.
Figure 11:
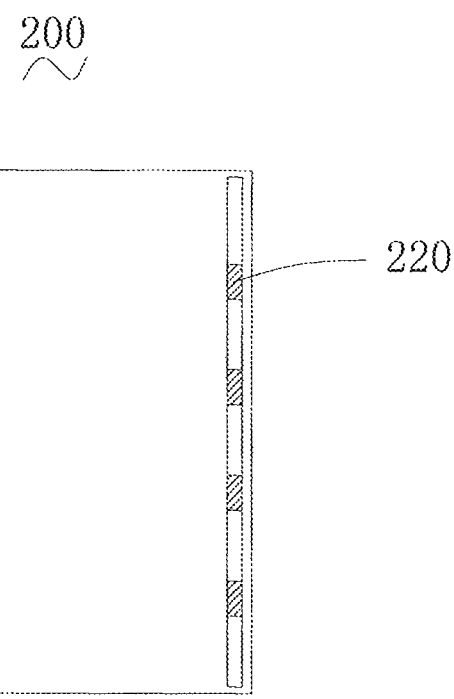
FIG. 11 is a back view showing a cell cutting piece according to Example One.

As shown in FIG. 10 and FIG. 11, in this example, the solar cell module includes cell cutting pieces 200 formed by cutting each solar cell piece into halves. Each cell cutting piece 200 includes a plurality of front electrodes 210 separated from each other and arranged along the length of the cell cutting piece 200, and a plurality of back electrodes 220 separated from each other and arranged along the length of the cell cutting piece 200. The front electrodes 210 are equally spaced, and the back electrodes 220 are also equally spaced.

Figure 12:
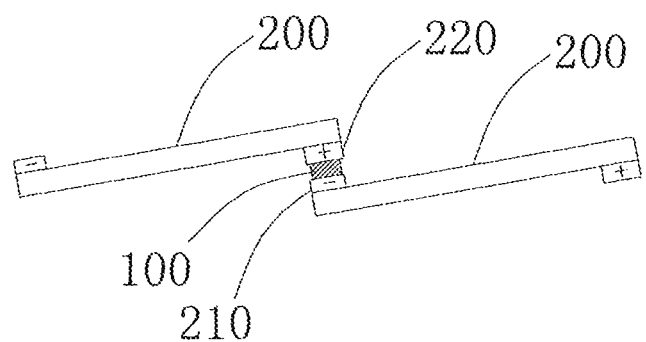
FIG. 12 is a side view showing a connection between two adjacent cell cutting pieces according to Example One.

The front electrodes 210 may be connected to the first connecting areas 111 on the first surface 110 of the connector 100, and the back electrodes 220 of the adjacent cell cutting piece 200 may be connected to the second connecting areas 121 on the second surface 120 of the connector 100, so that the two cell cutting pieces are stacked and connected in series to each other, as shown in FIG. 12.

In this example, the back electrodes 220 of the left cell cutting piece 200 has a width slightly larger than the front electrode 210 of the right cell cutting piece 200, and the connector 100 has a width smaller than that of the front electrode 210 of the right cell cutting piece 200, to avoid decrease in the irradiation area caused by the exposure of the front electrode 210 or the connector 100 due to deviation between the positions of the two adjacent cell cutting pieces 200 during their placement.

When two adjacent cell cutting pieces of the solar cell module in this embodiment are stacked and connected in series to each other, there is no gap between the two adjacent cell cutting pieces, so the effective area of the solar cell module is greatly improved, and the conversion efficiency of the solar cell module is improved.

Example Two

Figure 13:
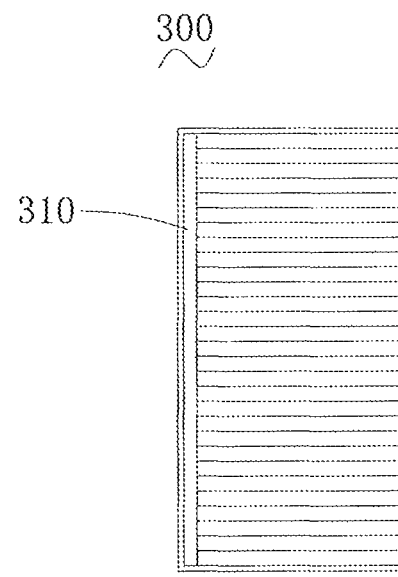
FIG. 13 is a front view showing a cell cutting piece according to Example Two.
Figure 14:
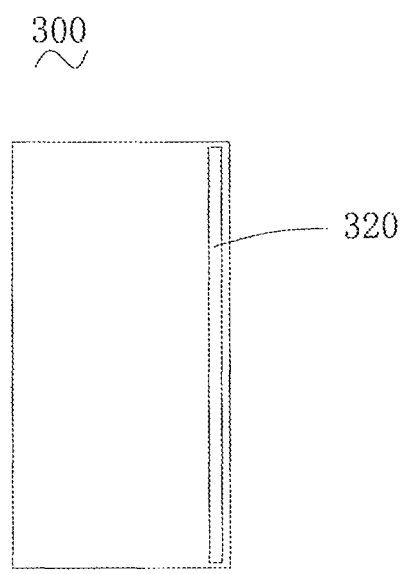
FIG. 14 is a back view showing a cell cutting piece according to Example Two.

As shown in FIG. 13 and FIG. 14, in this example, the solar cell module includes cell cutting pieces 300 formed by cutting each solar cell into halves. Each cell cutting piece 300 include a front electrode 310 and a back electrode 320 both extending along the length of the cell cutting piece 300. The front electrode 310 and the back electrode 320 are arranged on edges of opposite ends of the cell cutting piece 3, respectively.

Figure 15:
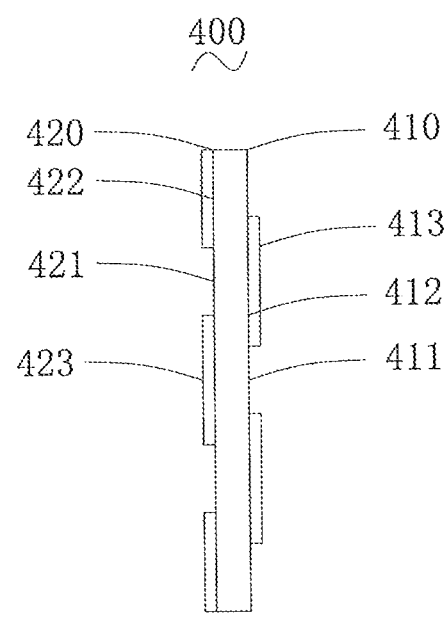
FIG. 15 is a side view showing a connector according to Example Two.

As shown in FIG. 15, in this example, the connector 400 includes a first surface 410 connected to the front electrode and a second surface 420 connected to the back electrode. The first surface 410 is provided with alternating alternating first connecting areas 411 and first disconnecting areas 412. The second surface 420 is provided with alternating alternating second connecting areas 421 and second disconnecting areas 422. The projections of the first disconnecting areas 412 on the first surface 410 overlap with projections of the second connecting areas 421 on the first surface 410.

In addition, each first disconnecting area 412 and each second disconnecting area 422 are provided with a first welding barrier 413 and a second welding barrier 423 respectively. In this embodiment, both the first welding barrier 413 and the second welding barrier 423 are ink coatings. It will be appreciated that the first welding barrier 413 and the second welding barrier 423 may be other coatings with the function of blocking welding. When two adjacent cell cutting pieces 300 are stacked and connected in series by the connector 400, the first and second welding barriers 413, 423 are adapted to block the welding, and have certain flexibility to act as a buffer. In this way, the flexibility of the solar cell module is improved, so that the solar cell module has enough flexibility to be deformed to withstand various external and internal stresses, to reduce the cracking risk in the solar cell module. Grid lines or cells of the solar cell module are difficult to be broken, so the traditional solar cell module thus is convenient to practical application.

Embodiment Three

Figure 16:
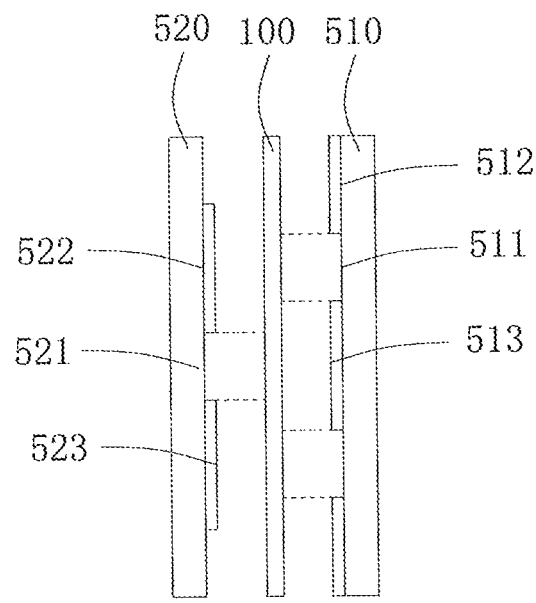
FIG. 16 is a side view showing a front electrode, a connector, and a back electrode of an adjacent cell cutting piece according to Example Two.

In this example, both the front electrode 510 and the back electrode 520 extend along the length of the cell cutting pieces. As shown in FIG. 16, the front electrode is provided with alternating third connecting areas 511 and third disconnecting areas 512. The back electrode is provided with alternating fourth connecting areas 521 and fourth disconnecting areas 522.

The third connecting areas 511 are adapted to connect the first connecting areas 100. The fourth connecting areas 521 are adapted to connect the second connecting areas of the connector 100. Each third disconnecting area 512 and each fourth disconnecting area 522 are provided with a third welding barrier 513 and a fourth welding barrier 523, respectively. In this example, both the third welding barrier 513 and the fourth welding barrier 523 are adhesive sticker. It will be appreciated that the third welding barrier 513 and the fourth welding barrier 523 may be other coatings with the function of blocking welding. When two adjacent cell cutting pieces are stacked and connected in series by the connector 100, the third and fourth welding barriers 513, 523 are adapted to block the welding, and have certain flexibility to act as a buffer. In this way, the flexibility of the solar cell module is improved, so that the solar cell module has enough flexibility to be deformed to withstand various external and internal stresses, to reduce the risk of cracking in the solar cell module and risk of breaking of grid lines or cells of the solar cell, which is advantageous for practical application.

Various technical features in the above embodiments can be combined arbitrarily. To simplify the description, not all the possible combinations of the various technical features are described, however, it will be appreciated that all the combinations fall into the scope of the disclosure as long as there is no conflict in these combinations.

The above are preferred embodiments of the disclosure described in detail, and should not be deemed as limitations to the scope of the present disclosure. It should be noted that variations and improvements will become apparent to those skilled in the art to which the present disclosure pertains without departing from its spirit and scope. Therefore, the scope of the present disclosure is defined by the appended claims.

What is claimed is:

1. A solar cell module, comprising a plurality of cell cutting pieces stacked and connected in series, and a connector adapted to connect two adjacent cell cutting pieces in series, the cell cutting pieces being cut from a solar cell, each cell cutting piece including a front electrode and a back electrode, wherein the connector includes a first surface adapted to connect the front electrode and a second surface adapted to connect the back electrode, the first surface is provided with alternating first connecting areas and first disconnecting areas, the second surface is provided with alternating second connecting areas and second disconnecting areas, and projections of the first disconnecting areas on the first surface overlap with projections of the second connecting areas on the first surface, and wherein the front electrode is adapted to connect the first connecting areas, and the back electrode is adapted to connect the second connecting areas, wherein each of the first surface and the second surface is flat, wherein the first surface overlaps with the second surface in thickness direction of the connector.

2. The solar cell module of claim 1, wherein the projections of the first connecting areas on the first surface are first projections, the projections of the second connecting areas on the first surface are second projections, and any one of the first projections is 1 mm to 20 mm away from an adjacent second projection.

3. The solar cell module of claim 1, wherein each cell cutting piece includes a plurality of front electrodes separated from each other and arranged along the length of the cell cutting piece, and a plurality of back electrodes separated from each other and arranged along the length of the cell cutting piece.

4. The solar cell module of claim 1, wherein both the front electrode and the back electrode extend along the length of the cell cutting piece, and each first disconnecting area and each second disconnecting area are provided with a first welding barrier and a second welding barrier respectively.

5. The solar cell module of claim 1, wherein both the front electrode and the back electrode extend along the length of the cell cutting piece, the front electrode is provided with alternating third connecting areas and third disconnecting areas, and the back electrode is provided with alternating fourth connecting areas and fourth disconnecting areas; and third connecting areas are adapted to connect the first connecting areas, the fourth connecting areas are adapted to connect the second connecting areas, and each third disconnecting area and each fourth disconnecting area are provided with a third welding barrier and a fourth welding barrier respectively.

6. The solar cell module of claim 1, wherein the connector includes a first connecting plate, a second connecting plate and a buffer plate positioned between the first connecting plate and the second connecting plate, wherein two ends of the buffer plate are connected to the first connecting plate and the second connecting plate respectively, and wherein a deformation space is formed between the buffer plate and the first connecting plate, and between the buffer plate and the second connecting plate respectively.

7. The solar cell module of claim 1, wherein the connector has a lateral side provided with a groove or a through hole.

8. A method for manufacturing a solar cell module, comprising:

providing cell cutting pieces, the cell cutting pieces being cut from a solar cell, each cell cutting piece including a plurality of front electrodes separated from each other and arranged along the length of the cell cutting piece, and a plurality of back electrodes separated from each other and arranged along the length of the cell cutting piece;

providing connectors, each connector including a first surface corresponding to the plurality of front electrodes, and a second surface corresponding to the plurality of back electrodes;

connecting the front electrodes to the first surface to form alternating first connecting areas and first disconnecting areas on the first surface, and connecting the back electrodes of an adjacent cell cutting piece to the second surface to form alternating second connecting areas and second disconnecting, areas on the second surface, so that the cell cutting pieces are connected in series with each other, wherein projections of the first disconnecting areas on the first surface overlap with projections of the second connecting areas on the first surface; and stacking and connecting the cell cutting pieces in a series-parallel connection form to obtain the solar cell module, wherein each of the first surface and the second surface is flat, wherein the first surface overlaps with the second surface in thickness direction of the connector.

9. A method for manufacturing a solar cell module, comprising:

providing cell cutting pieces, the cell cutting pieces being cut from a solar cell, each cell cutting piece including a front electrode and a back electrode both extending along the length of the cell cutting piece;

providing a connector, the connector including a first surface corresponding to the plurality of front electrodes, and a second surface corresponding to the plurality of back electrodes;

arranging a plurality of first welding barriers separated from each other on the first surface, to form first disconnecting areas for blocking welding, and first connecting areas each positioned between two adjacent first disconnecting areas, the first connecting areas and the first disconnecting areas being arranged alternately;

arranging a plurality of second welding barriers separated from each other on the second surface, to form second disconnecting areas and second connecting areas, each positioned between two adjacent second disconnecting areas, the second connecting areas and the second disconnecting areas being arranged alternately, projections of the first disconnecting areas on the first surface overlapping with projections of the second connecting areas on the first surface;

connecting the first connecting areas to the front electrode, and connecting the second connecting areas to the back electrode, to make the cell cutting pieces connected in series with each other; and stacking and connecting the cell cutting pieces in a series-parallel connection form to obtain the solar cell module, wherein each of the first surface and the second surface is flat, wherein the first surface overlaps with the second surface in thickness direction of the connector.

10. A method for manufacturing a solar cell module, comprising:

providing cell cutting pieces, the cell cutting pieces being cut from a solar cell, each cell cutting piece including a front electrode and a back electrode both extending along the length of the cell cutting piece;

providing a connector, the connector including a first surface corresponding to the plurality of front electrodes, and a second surface corresponding to the plurality of back electrodes;

arranging a plurality of third welding barriers separated from each other on the front electrode, to form third disconnecting areas for blocking welding, and third connecting, areas each positioned between two adjacent, third disconnecting areas, the third connecting areas and the third disconnecting areas being arranged alternately;

arranging a plurality of fourth welding barriers separated from each other on the back electrode, to form fourth disconnecting areas for blocking welding, and fourth connecting areas each positioned between two adjacent fourth disconnecting areas, the fourth connecting areas and the fourth disconnecting areas being arranged alternately;

connecting the third connecting areas to the first surface to form alternating first connecting areas and first disconnecting areas on the first surface, and connecting the fourth connecting areas to the second surface to form alternating second connecting areas and second disconnecting areas on the second surface, so that the cell cutting pieces are connected in series with each other, wherein projections of the first disconnecting areas on the first surface overlap with projections of the second connecting areas on the first surface; and stacking and connecting, the cell cutting pieces in a series-parallel connection form to obtain the solar cell module, wherein each of the first surface and the second surface is flat, wherein the first surface overlaps with the second surface in thickness direction of the connector.

\* \* \* \* \*